(12) United States Patent
Iwakura

(10) Patent No.: US 10,326,060 B2
(45) Date of Patent: Jun. 18, 2019

(54) LIGHT EMITTING DEVICE

(71) Applicant: NICHIA CORPORATION, Anan-shi (JP)

(72) Inventor: Daisuke Iwakura, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/662,287

(22) Filed: Jul. 28, 2017

(65) Prior Publication Data
US 2018/0033922 A1    Feb. 1, 2018

(30) Foreign Application Priority Data

Jul. 29, 2016    (JP) .................. 2016-150081

(51) Int. Cl.
*H01L 33/50*    (2010.01)
*H01L 33/46*    (2010.01)
*H01L 33/60*    (2010.01)
*H01L 33/62*    (2010.01)

(52) U.S. Cl.
CPC ............ *H01L 33/504* (2013.01); *H01L 33/46* (2013.01); *H01L 33/508* (2013.01); *H01L 33/60* (2013.01); *H01L 33/62* (2013.01); *H01L 2224/32245* (2013.01); *H01L 2224/48091* (2013.01); *H01L 2224/48247* (2013.01); *H01L 2224/48257* (2013.01); *H01L 2224/49107* (2013.01); *H01L 2224/73265* (2013.01); *H01L 2933/005* (2013.01); *H01L 2933/0033* (2013.01); *H01L 2933/0041* (2013.01); *H01L 2933/0058* (2013.01)

(58) Field of Classification Search
CPC ........... H01L 33/50–33/508; H01L 2933/0041
See application file for complete search history.

(56) References Cited

U.S. PATENT DOCUMENTS

| 2009/0140633 A1 | 6/2009 | Tanimoto et al. |
| 2009/0153022 A1* | 6/2009 | Hussell .................... H01L 33/50 313/503 |

(Continued)

FOREIGN PATENT DOCUMENTS

| DE | 10 2015 101 143 | 7/2016 |
| JP | 2004-071726 | 3/2004 |

(Continued)

*Primary Examiner* — Tucker J Wright
(74) *Attorney, Agent, or Firm* — Mori & Ward, LLP

(57) ABSTRACT

A light emitting device includes a light emitting element to emit a first light having a first peak wavelength. A second wavelength converting member contains a second phosphor to convert the first light into a third light having a third peak wavelength longer than the first peak wavelength and shorter than a second peak wavelength. The second wavelength converting member includes a portion in which the second wavelength converting member has a first concentration of the second phosphor at a height of an upper surface of the light emitting element in a height direction and a second concentration of the second phosphor at a height of a lower surface of the light emitting element in the height direction. The second concentration is higher than the first concentration such that the second phosphor reflects the second light.

16 Claims, 8 Drawing Sheets

(56) References Cited

U.S. PATENT DOCUMENTS

| | | | |
|---|---|---|---|
| 2010/0044735 A1* | 2/2010 | Oyamada | H01L 33/504 257/98 |
| 2014/0070243 A1 | 3/2014 | Kim et al. | |
| 2015/0008464 A1 | 1/2015 | Iwakura | |
| 2016/0093780 A1 | 3/2016 | Beppu et al. | |

FOREIGN PATENT DOCUMENTS

| | | |
|---|---|---|
| JP | 2005-228996 | 8/2005 |
| JP | 2007-184326 | 7/2007 |
| JP | 2007-184330 | 7/2007 |
| JP | 2009-182241 | 8/2009 |
| JP | 2011-243977 | 12/2011 |
| WO | WO 2007/052777 | 5/2007 |
| WO | WO 2016/119973 | 8/2016 |

* cited by examiner

LIGHT EMITTING DEVICE

CROSS-REFERENCE TO RELATED APPLICATIONS

The present application claims priority under 35 U.S.C. § 119 to Japanese Patent Application No. 2016-150081, filed Jul. 29, 2016. The contents of this application are incorporated herein by reference in their entirety.

BACKGROUND

The present disclosure relates to a light emitting device and a manufacturing method for the same.

Light emitting devices using semiconductor light emitting elements such as LEDs (light emitting diodes) are widely used in various market segments, including backlights, lighting equipment, and automotive headlights. Light emitting devices using a blue LED and various phosphors such as green to yellow phosphors and red phosphors have been proposed to output white light having high color rendering quality. Several types of phosphors are commonly mixed into a sealing resin to be applied on the surface of an LED. If several types of phosphors are used in a mixture, however, yellowish green phosphors having larger specific gravity and particle diameters settle to the bottom first. Thus, the light emitted from yellowish green phosphors is readily absorbed by red phosphors. Red phosphors are also excited by the light from yellowish green phosphors and emit red light. Since the excitation of red phosphors takes place in two stages, the wavelength conversion efficiency is reduced from the standpoint of converting the wavelength of the blue light from a blue LED, which leads to a reduction of output of a white light source.

For example, Japanese patent publications 1-5, i.e., Japanese Unexamined Patent Application Publication Numbers 2007-184330, 2007-184326, 2009-182241, 2005-228996, and 2004-71726, disclose light emitting devices which employ a combination of a blue LED and various types of phosphors such as green and red phosphors. These patent publications propose light emitting devices constructed by disposing a red phosphor layer and a green phosphor layer in that order from the blue LED side so as to make it more difficult for the green light from the green phosphor to be absorbed by the red phosphor.

Moreover, Japanese patent publication 6, i.e., Japanese Unexamined Patent Application Publication Number 2011-243977, for example, proposes a light emitting device provided with a reflective film on the lower face side of the LED to increase the optical output from the upper face and the lateral faces thereof.

SUMMARY

A light emitting device according to an embodiment of the present disclosure includes a base, a light emitting element, a first wavelength converting member, and a second wavelength converting member. The light emitting element is disposed on the base to emit a first light having a first peak wavelength. The light emitting element has a lower surface facing the base, an upper surface opposite to the lower surface in a height direction of the light emitting device, and lateral surfaces connecting the upper surface and the lower surface. The first wavelength converting member covers the lateral surfaces of the light emitting element and contains a first phosphor to convert the first light emitted from the light emitting element into a second light having a second peak wavelength longer than the first peak wavelength. The second wavelength converting member covers the upper surface of the light emitting element and the base and contains a second phosphor to convert the first light emitted from the light emitting element into a third light having a third peak wavelength longer than the first peak wavelength and shorter than the second peak wavelength. The second wavelength converting member includes a portion which covers the base and in which the second wavelength converting member has a first concentration of the second phosphor at a height of the upper surface of the light emitting element in the height direction and a second concentration of the second phosphor at a height of the lower surface of the light emitting element in the height direction, the second concentration being higher than the first concentration such that the second phosphor reflects the second light.

A light emitting device according to another aspect of the present disclosure includes a base, a light emitting element, a first wavelength converting member, and a second wavelength converting member. The light emitting element is disposed on the base to emit a first light having a first peak wavelength. The light emitting element has a lower surface facing the base, an upper surface opposite to the lower surface in a height direction of the light emitting device, and lateral surfaces connecting the upper surface and the lower surface. The first wavelength converting member covers the lateral surfaces of the light emitting element and contains a first phosphor to convert the first light emitted from the light emitting element into a second light having a second peak wavelength longer than the first peak wavelength. The second wavelength converting member covers the upper surface of the light emitting element and the base and contains a second phosphor to convert the first light emitted from the light emitting element into a third light having a third peak wavelength longer than the first peak wavelength and shorter than the second peak emission wavelength. The second wavelength converting member has a first cross-sectional area and a second a second cross sectional area which are taken along a plane parallel to the height direction. The first cross-sectional area ranges from a height of the upper surface of the light emitting element to a middle height between the upper surface and the lower surface of the light emitting element in the height direction and has a first area ratio which is a percentage of a cross-sectional area of the second phosphor particles taken along the plane in the first cross-sectional area. The second cross-sectional area ranges from the middle height to the base and has a second area ratio which is a percentage of a cross-sectional area of the second phosphor particles taken along the plane in the second cross-sectional area and which is higher than the first area ratio.

A light emitting device according to further aspect of the present disclosure includes a base, a light emitting element, a first wavelength converting member, and a second wavelength converting member. The light emitting element is disposed on the base to emit a first light having a first peak wavelength. The light emitting element having a lower surface facing the base, an upper surface opposite to the lower surface in a height direction of the light emitting device, and lateral surfaces connecting the upper surface and the lower surface. The first wavelength converting member covers the lateral surfaces of the light emitting element and contains a first phosphor to convert the first light emitted from the light emitting element into a second light having a second peak wavelength longer than the first peak wavelength. The second wavelength converting member covers the upper surface of the light emitting element and the base, and contains a second phosphor to convert the first light emitted from the light emitting element into a third light having a third peak wavelength longer than the first peak wavelength and shorter than the second peak wavelength. The second wavelength converting member has a portion in which the second phosphor is disposed in a form of a layer at least in a portion where the second wavelength converting member covers the base. A thickness of the layer is equal to or lower than three quarters of the height of the light emitting element.

A method for manufacturing a light emitting device according to further embodiment of the present disclosure includes disposing at least one light emitting element on a support material. A first wavelength converting member containing a first phosphor is disposed on the lateral surfaces of the light emitting element. The light emitting element provided with the first wavelength converting member is disposed on a base. A second wavelength converting member covering the upper surface and the lateral surfaces of the light emitting element is provided with the first wavelength converting member and contains a second phosphor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
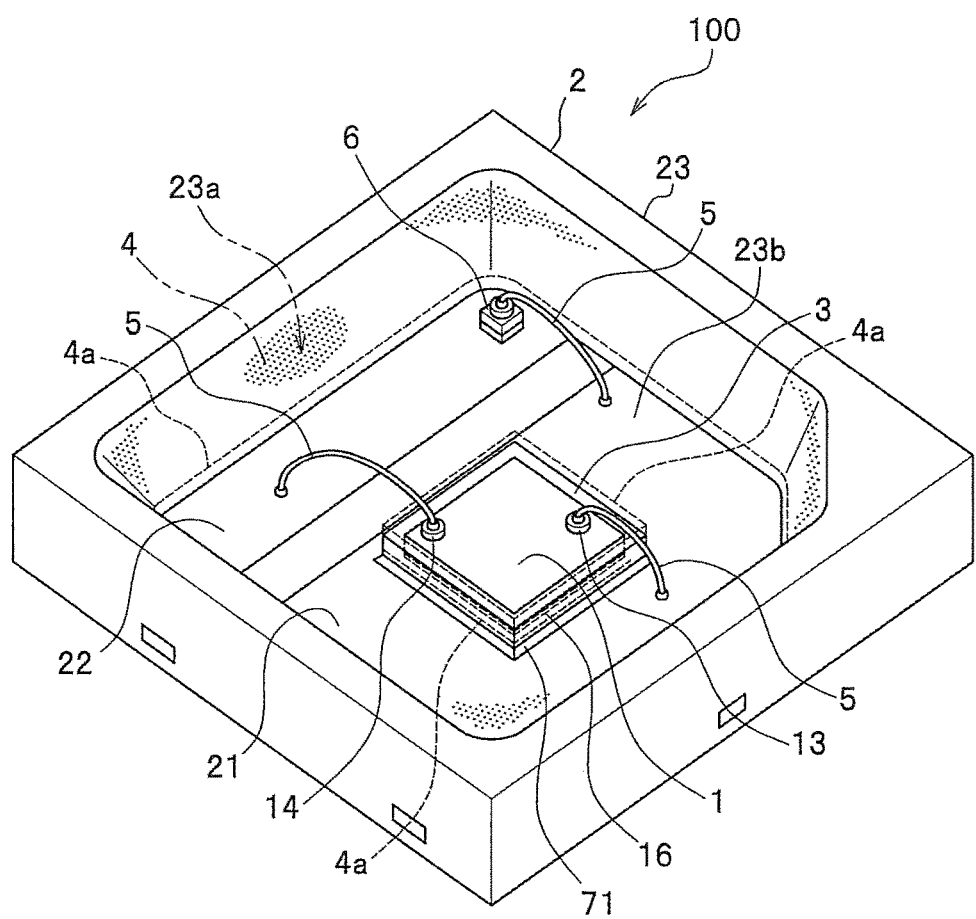
FIG. 1A is a perspective view of the light emitting device according to an embodiment.

The embodiments will now be described with reference to the accompanying drawings, wherein like reference numerals designate corresponding or identical elements throughout the various drawings.

The light emitting device according to one embodiment and the method for manufacturing the same will be explained below.

Since the drawings referenced in the following explanation schematically show the embodiment, the scale of each member, as well as the spacing and positional relationship between members, may be exaggerated or a portion of a member may be omitted. Moreover, the scale of each member and the spacing between the members may not match between the plan view and the sectional views. In the explanations given below, furthermore, the same designations and reference numerals indicate the components that are identical or of the same nature, for which the explanations will be omitted when appropriate.

In the explanations of the light emitting device according to the embodiment and the method of manufacturing the same, moreover, "upper," "lower," "left," and "right" may be switched depending on the situation. The terms such as "upper" and "lower" herein indicate relative positions of the constituent elements in the drawings referenced for explanation purposes, and are not intended to show their absolute positions unless otherwise specifically noted.

The relationship between a color name and chromaticity coordinates, and the relationship between a wavelength range and a color name of monochromatic light are in accordance with the Japanese Industrial Standards JISZ 8110 unless otherwise specifically noted. Specifically, the wavelengths of monochromatic light ranging from 380 nm to 455 nm is a blue-violet color, 455 nm to 485 nm is a blue color, 485 nm to 495 nm is a blue-green color, 495 nm to 548 nm is a green color, 548 nm to 573 nm is a yellow-green color, 573 nm to 584 nm is a yellow color, 584 nm to 610 nm is a yellow-red color, and 610 nm to 780 nm is a red color.

Light Emitting Device

The light emitting device according to an embodiment will be explained with reference to FIGS. 1A-1C.

FIG. 1A is a perspective view of a light emitting device according to the embodiment. FIG. 1B is a plan view of the light emitting device according to the embodiment. FIG. 1C is a cross-sectional view taken along line IC-IC in FIG. 1B.

Figure 1B:
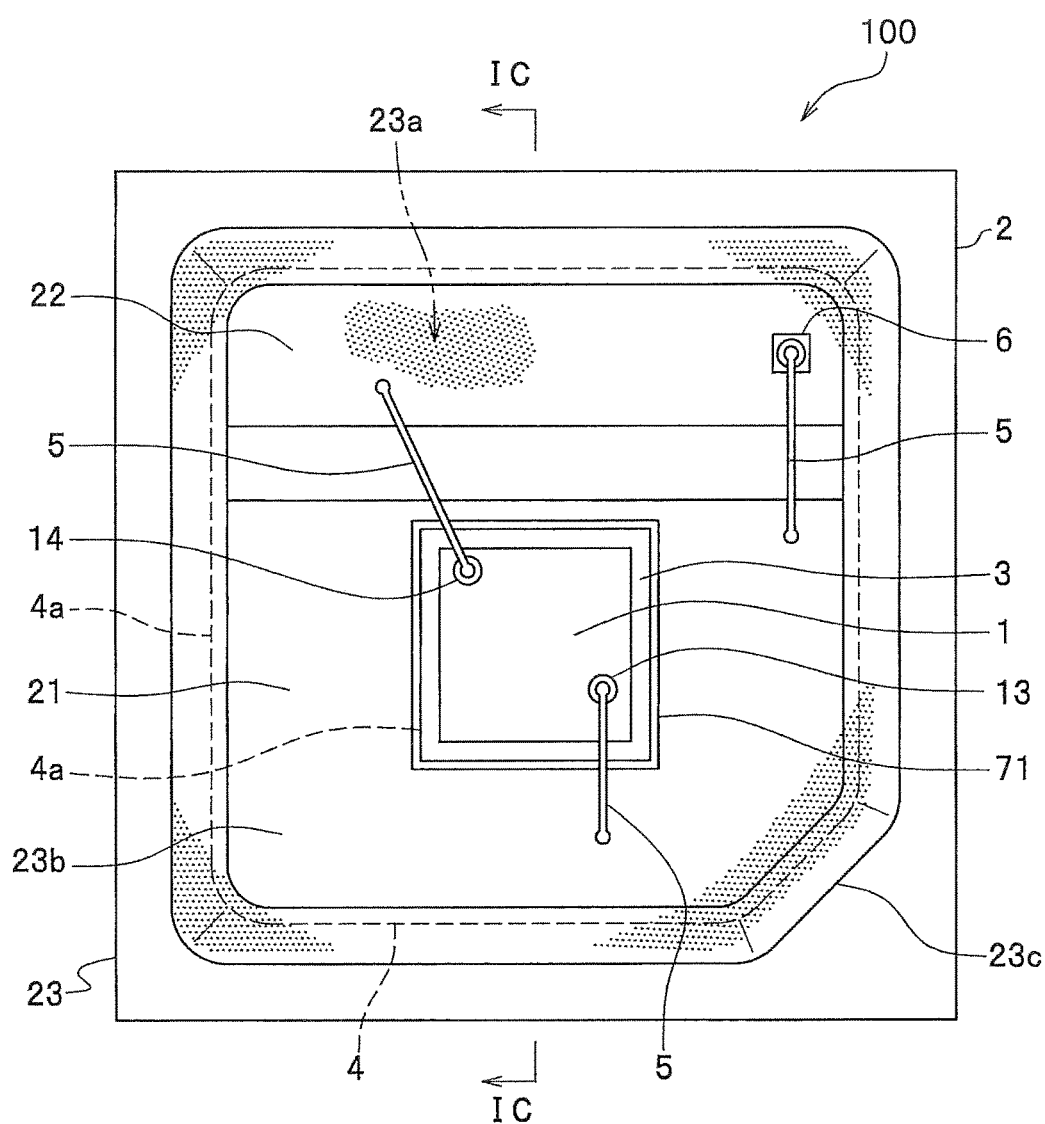
FIG. 1B is a plan view of the light emitting device according to the embodiment.

In the FIGS. 1A and 1B, the stippled portions indicate the presence of a second wavelength converting member 4 in the recessed portion 23a.

Figure 1C:
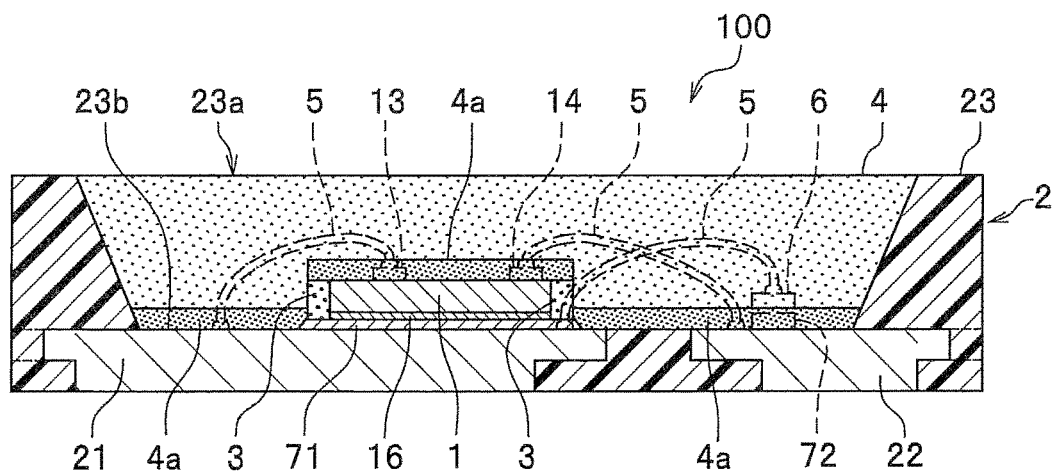
FIG. 1C is a cross-sectional view of the light emitting device according to the embodiment taken along line IC-IC in FIG. 1B.

In the cross-section shown in FIG. 1C, moreover, portions of the wires 5, the protective device 6, and the bonding member 72 are not observed because they are located in the foreground of the cross section, but are shown using broken lines for explanation purposes. This is true for FIG. 4A, FIG. 7-FIG. 8B described later.

Moreover, in FIGS. 1A-1C, and the later described FIGS. 6A-8B, the n-side electrode 13 and the p-side electrode 14 of the light emitting element 1 are shown in a simplified manner, i.e., only the portions corresponding to the external connection parts 13a and 142a of the electrodes are shown in the figures.

The light emitting device 100 according to this embodiment is constructed with a light emitting element 1 which is substantially a square in a plan view; a package (base) 2 which is a base for mounting the light emitting element 1 and shaped substantially square in a plan view; a first wavelength converting member 3 which covers the lateral faces (surfaces) of the light emitting element 1; and a second wavelength converting member 4 which covers the upper face (surface) of the light emitting member 1 as well as the upper and lateral faces of the first wavelength converting member 3.

The light emitting element 1 is disposed in the recessed portion 23a of the package 2 which is open on the upper face side, and is bonded to the bottom face 23b of the recessed portion 23a using a light transmissive bonding member 71. The light emitting element 1 is electrically connected at its positive and negative pad electrodes, n-side electrode 13 and p-side electrode 14, to the lead electrodes 21 and 22 of corresponding polarities exposed at the bottom face 23b of the recessed portion 23a individually using a bonding wire 5.

Moreover, a protective device 6 is disposed in the recessed portion 23a, which is connected to the lead electrodes 21 and 22 using a wire 5 and a conductive bonding member 72, respectively. The second wavelength converting member 4 is disposed in the recessed portion 23a to seal the light emitting element 1 and the protective device 6.

The light emitted by the light emitting element 1 is released upwardly from the opening of the recessed portion 23a in the mixture of a portion whose wavelength is converted by the first phosphor contained in the first wavelength converting member 3, another portion whose wavelength is converted by the second phosphor contained in the second wavelength converting member 4, and the remaining portion whose wavelength is not converted at all.

In the light emitting device 100 of the present embodiment, moreover, one light emitting element 1 is installed, but two or more can be installed alternatively.

Figure 2:
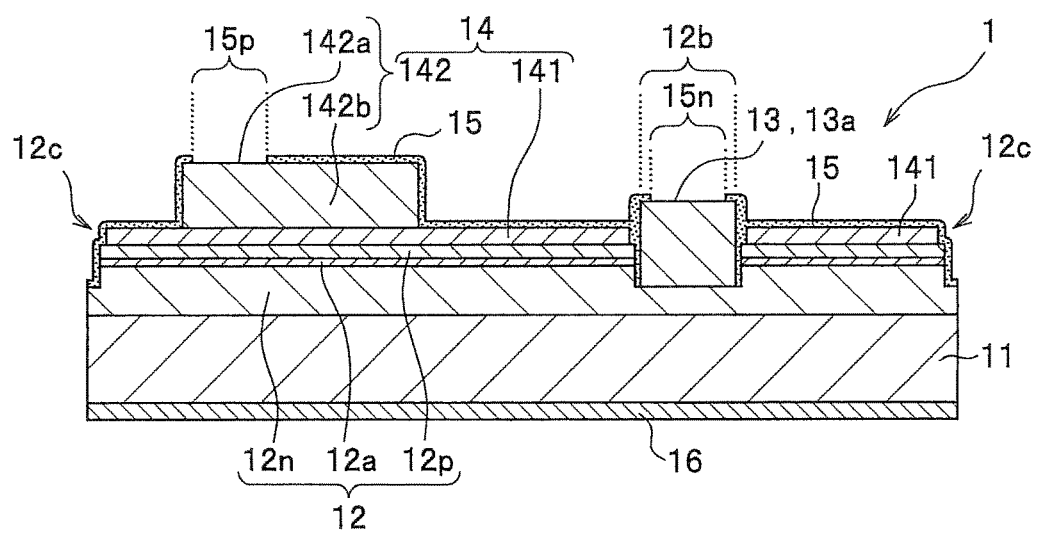
FIG. 2 is a cross-sectional view of an example of the light emitting element used in the light emitting device according to the embodiment.

Here, an example of the constitution of the light emitting element 1 will be explained. FIG. 2 is a sectional view showing an example of the light emitting element used in the light emitting device in the present embodiment.

In the present embodiment, since the light emitting device 100 is of a top view type, the light emitting element 1 is mounted so that the principal faces of its substrate 11 are in parallel to the bottom face 23b of the recessed portion 23a which faces the upper face side of light emitting device 100.

For the light emitting element 1, a semiconductor light emitting element such as an LED can be suitably used. The light emitting element in the present embodiment, substantially square-shaped in a plan view, is constructed with an n-side electrode 13, a p-side electrode 14, a protective film 15, and a reflective film 16. Furthermore, the light emitting element 1 of the present embodiment is equipped with a semiconductor stack 12 having an LED structure, and is further equipped with an n-side electrode 13 and a p-side electrode 14 on one face of the semiconductor stack 12. That is, it has a structure suited for face up mounting.

The substrate 11 supports the semiconductor stack 12. The substrate 11 may alternatively be a growth substrate to allow for the epitaxial growth of the semiconductor stack 12. For the substrate 11, in the case of using a nitride semiconductor for the semiconductor stack 12, for example, a sapphire ($Al_2O_3$) substrate can be used.

The semiconductor stack 12 is made by stacking an n-type semiconductor layer 12n and a p-type semiconductor layer 12p on one of the principal faces of the substrate 11, and is adapted to emit light when current is supplied between the n-side electrode 13 and the p-side electrode 14. The semiconductor stack 12 is preferably provided with an active layer 12a between the n-type semiconductor layer 12n and the p-type semiconductor layer 12p.

The semiconductor stack 12 is provided with a step 12b, a recess made from the surface of the p-type semiconductor 12p where the p-type semiconductor 12p and the active layer 12a are not present. The n-type semiconductor 12n faints the bottom face of the step 12b, and an n-side electrode 13 is disposed at the bottom which is electrically connected to the n-type semiconductor layer 12n.

A step 12c where no p-type semiconductor layer 12p or active layer 12a is present is also formed along the outer perimeter of the light emitting element 1. The step 12c serves as dicing streets when cutting the wafer into individual light emitting elements.

For the semiconductor stack 12, one formed by stacking semiconductor layers on a substrate by liquid phase growth, MOCVD, or the like is suitably used. For the semiconductor material, nitride gallium-based semiconductors expressed by $In_XAl_YGa_{1-X-Y}N$ ($0 \le X$, $0 \le Y$, $X+Y<1$) can suitably be used because they provide a wide range of emission wavelengths from ultraviolet to infrared depending on the composition-ratio of a mixed crystal.

The n-side electrode 13 is disposed to be electrically connected to the n-type semiconductor layer 12n at the bottom face of the step 12b of the semiconductor stack 12 serving as the negative electrode for supplying electrical current to the light emitting element 1 from the outside. The n-side electrode 13, moreover, has an external connection part 13a at one corner of the light emitting element 1 in a plan view.

For the n-side electrode 13, a suitable material for external connection by wire bonding or the like, such as Cu, Au, or an alloy having either of these metals as a main component, can be used.

The p-side electrode 14 is disposed to be electrically connected to the p-type semiconductor layer 12p at the upper face of the p-type semiconductor layer 12p serving as the positive electrode for supplying electrical current to the light emitting element 1 from the outside. The p-side electrode 14 has a structure in which a light transmitting electrode 141 and a pad electrode 142 are stacked.

The light transmitting electrode 141, the lower layer, is disposed to cover substantially the entire upper surface of the p-type semiconductor layer 12p. The light transmitting electrode 141 functions as a current diffusion layer to spread the electrical current externally supplied via the pad electrode 142 across the entire surface of the p-type semiconductor layer 12p. The light transmitting electrode 141 can be formed by using a conductive metal oxide, and ITO (Sn-doped $In_2O_3$) is particularly preferable because of its high level of transmittance in the visible spectrum (visible range) as well as high electrical conductivity.

The pad electrode 142, the upper layer, is provided on the upper face of the light transmitting electrode 141 in one area for connection with an external electrode. The pad electrode 142 includes an external connection part 142a for external connection by way of wire bonding or the like, and an extended portion 142b which extends from the external connection part 142a. The extended portion 142b is positioned to efficiently spread electrical current. For the pad electrode 142, similar to the n-side electrode 13 described earlier, Cu, Au, or an ally having either of these metals, for example, can be used.

In the present embodiment, the pad electrode 142 has the external connection part 142a and the extended portion 142b both made of the same material.

The protective film 15 has light transmitting and insulating properties, and covers the upper and lateral faces of the light emitting element 1 substantially entirely, excluding the lateral and lower faces of the substrate. The protective film 15 has an opening 15n on the upper face of the n-side electrode 13, and an opening 15p on the upper face of the pad electrode 142 of the p-side electrode 14. The areas exposed at the openings 15n and 15p correspond to the external connection parts 13a and 142a.

For the protective film 15, for example, an oxide such as $SiO_2$, $TiO_2$, $Al_2O_3$, or the like, a nitride such as SiN, or a fluoride such as MgF can be suitably used.

The reflective film 16 is provided on the lower face side of the substrate 11, which is opposite the light extraction face of the of the light emitting element 1. Preferably, a distributed Bragg reflector (DBR) film formed from multiple layers of dielectric materials with varying refractive indices is used for the reflective film 16. Examples of dielectric materials that can be used in the DBR film include a combination of $SiO_2$ and $Nb_2O_5$.

In the case of using a DBR film as the reflective film 16, it is preferable to determine the thickness of each of the multiple dielectric layers so that the center of the high-reflectivity wavelength range coincides with the peak emission wavelength of the light emitting element 1. This allows for the light emitted by the light emitting element 1 to be introduced into the first wavelength converting member 3 disposed on the lateral faces of the light emitting element 1 or the second wavelength converting member 4 disposed on the upper face of the light emitting element 1.

Here, the instance where the light emitting element 1 emits blue light and the first phosphor contained in the first wavelength converting member 3 emits red light will be explained. The DBR film, the reflective film 16, when designed so that the center of the high-reflectivity wavelength range coincides with the peak emission wavelength (a first peak wavelength) of the light emitting element 1, will have the characteristics of transmitting a large portion of the red light emitted by the first phosphor.

Accordingly, downward propagating light whose wavelength is being converted by the first phosphor will transmit through the light reflective film 16 and enters the light transmissive bonding member 71.

The plan view outer shape of the light emitting element 1 is not limited to a square, and can be any polygon, such as a rectangle, triangle, or hexagon, or a circular or oval shape. In the light emitting element 1, moreover, the locations, shapes, and layering structure of the n-side electrode 13 and p-side electrode 14, the location and shape of the step 12b, or the like are not limited to those employed in the present embodiment, and can be suitably determined.

Referring back to FIGS. 1A-1C, the construction of the light emitting device 100 will be explained further.

The package (base) 2 is constructed with lead electrodes 21 and 22, and a resin portion 23. The package 2 has a substantially square outer shape in a plan view, and has a substantially quadrangular prism shape flatly formed in the thickness direction of the light emitting device 100. The package 2 has an opening, a recessed portion 23a, on the upper face, in which the light emitting element 1 is installed. It is structured to release light from the opening and thus is suited for top-view type mounting.

The lead electrode 21 and the lead electrode 22 are a pair of electrodes of positive and negative polarities. The lead electrodes 21 and 22 are supported by the resin member 23, and arranged in such a way that the upper face of the lead electrode 21 and the upper face of the lead electrode 22 are spaced apart, and are exposed at the bottom face 23b of the recessed portion 23a.

The lower face of the package 2, where the lead electrodes 21 and 22 are exposed, is a mounting face of the light emitting device 100 for external connection. Accordingly, the light emitting device 100 is mounted by facing its bottom face to a mounting substrate and bonding the lower faces of the lead electrodes 21 and 22 to the wiring pattern of the mounting substrate using a conductive bonding member such as solder.

The lead electrodes 21 and 22 are formed by using sheet metal, and the thickness thereof may be uniform, or partly thicker or thinner.

There are no particular restrictions for the material to be used for the lead electrodes 21 and 22, but a material having a relatively high thermal conductivity, a relatively high mechanical strength, or a material which can be easily processed by blanking or etching is preferable. Specific examples include metals such as copper, aluminum, gold, silver, tungsten, iron, nickel, or the like, or alloys such as a nickel-iron alloy, phosphor bronze, or the like. It is preferable to apply reflective plating having good reflectance, such as Ag, to the surfaces of the inner leads 21a and 22a exposed at the bottom face 23b of the recessed portion 23a for efficient extraction of light from the light emitting element 1, the first wavelength converting member 3, and the second wavelength converting member 4.

The resin portion 23 is the base body of the package 2 for supporting the lead electrodes 21 and 22. The resin portion 23 has a recessed portion 23a opened on the upper face side, and the lead electrodes 21 and 22 are disposed so as to be apart from one another and exposed at the bottom face 23b of the recessed portion 23a. The lead electrodes 21 and 22 are exposed on the lower face side of the resin portion 23 to function as the mounting face.

On the lead electrodes 21 and 22 which form the bottom face 23b of the recessed portion 23a, one piece of light emitting element 1 and one piece of protective device 6 are mounted. The inner lateral faces of the recessed portion 23a are oblique faces which are slanted so that the opening widens towards the top to reflect the light released laterally from the light emitting element 1 upwardly in the light extraction direction.

One of the corners of the substantially square recessed portion 23a when viewed from top is chamfered to serve as a cathode mark 23c to distinguish the polarity between the lead electrodes 21 and 22.

The resin part 23 is formed with a material imparted with light reflecting properties by containing particles of a light reflecting substance in a light transmissive resin to also function as a reflective member to reflect the light from the light emitting element 1 in the recessed portion 23a to be efficiently released at the top.

The recessed portion 23a, moreover, is filled with a light transmissive second wavelength converting member 4.

The resin material used for the resin portion 23 preferably has good light transmittance for the wavelengths of the light emitted by the light emitting element 1, and a thermosetting resin or thermoplastic resin can be used. Examples of thermosetting resins include silicone resins, silicone modified resins, silicone hybrid resins, epoxy resins, epoxy modified resins, urea resins, diallyl phthalate resins, phenol resins, unsaturated polyester resins, and hybrid resins containing two or more of these resins.

For the light reflecting substance to be contained in the resin portion 23, particles of a material having a large refractive index difference from that of the resin material among those listed above, and good transmittance can preferably be used. For such a light reflecting substance, the refractive index is preferably at least 1.8, for example, and the refractive index difference from that of the resin material used is preferably at least 0.4, for example. The average particle size of the light reflecting substance for achieving a high efficiency scattering effect is preferably in the range of from 0.08 μm to 10 μm.

Unless otherwise specifically noted, the particle size values of light reflecting substances and phosphors refer to average particle sizes measured by using an air permeability method or Fisher Sub-Sieve Sizers.

As a specific example, particles of white pigments, such as $TiO_2$ (titanium oxide), $Al_2O_3$ (aluminum oxide), can be used for the light reflecting substance. Among all, $TiO_2$ is preferable because it is relatively stable against moisture, has a high refractive index and high thermal conductivity.

The resin material contains the light reflecting substance to the extent that it achieves adequate light reflectance without allowing for the loss of package formability. For this purpose, the content of the light reflecting substance in the resin portion 23 is preferably in the range of from 10 mass % to 60 mass %.

The first wavelength converting member 3 is disposed to cover the lateral faces of the light emitting element 1, and converts the wavelength of a portion of the light emitted from the light emitting element 1 to light of another wavelength. For this purpose, the first wavelength converting member contains particles of a first phosphor which is a wavelength converting substance that converts the light from the light emitting element 1 to light having a longer peak emission wavelength (a second peak wavelength) than the peak emission wavelength of the light emitting element 1.

The first wavelength converting member 3 can be formed using a light transmissive resin material containing the first phosphor particles. A resin material similar to those that can be used for the resin portion 23 of the package 2 described earlier can be used.

The first wavelength converting member 3 is disposed to entirely cover the lateral faces of the light emitting element 1, but not disposed on the upper face of the light emitting element 1. Accordingly, on the upper face of the light emitting element 1, a second wavelength converting member 4 is disposed in contact with the light emitting element 1.

The second wavelength converting member 4 is disposed in the recessed portion 23a of the package 2 which is the base so as to cover the upper face of the light emitting element 1 and the upper and lateral faces of the first wavelength converting member 3, and converts the wavelength of a portion of the light emitted by the light emitting element 1 to light of another wavelength. For this purpose, the second wavelength converting member 4 contains particles of a second phosphor which is a wavelength converting substance that converts the light from the light emitting element 1 to light having a shorter peak emission wavelength (a third peak wavelength) than the peak emission wavelength of the light emitting element 1.

In the present embodiment, moreover, the second wavelength converting member 4 is also a sealing member that seals the light emitting element 1, the first wavelength converting member 3, the protective device 6, wires 5, and the like.

The second wavelength converting member 4 has a high-concentration portion 4a containing the second phosphor at a relatively high concentration on the bottom face 23b side of the recessed portion 23a, i.e., in the vicinity of the bottom face 23b, and on the upper face of the light emitting element 1 and the upper face of the first wavelength converting member 3.

It is preferable to arrange the particles of the second phosphor so that the first concentration, which is the concentration of the second phosphor at the height of the upper face of the light emitting element 1 is at most one half of the second concentration, which is the concentration of the second phosphor at the height of the lower face (surface) of the light emitting element 1, i.e., in the high-concentration portion 4a. Particularly, the first concentration is more preferably two fifths of the second concentration at most. In other words, in the second wavelength converting member 4, the second phosphor is localized near the bottom face 23b, and the second phosphor is arranged in the form of a layer in effect. This can reduce the percentage of the light from the first wavelength converting member 3 that is blocked by the second wavelength converting member 4, thereby allowing the light from the first wavelength converting member 3 to be released laterally.

The layer-form high-concentration portion 4a is preferably disposed so that its upper end does not exceed three quarters of the height of the first wavelength converting member 3, more preferably two thirds of the height at most. In other words, it is preferable to not effectively dispose the second phosphor in the portion at an upper quarter of the outer lateral faces of the first wavelength converting member 3 or higher, more preferably in the portion at an upper third thereof or higher.

By providing a portion without the second phosphor or a portion having a low concentration of the second phosphor at the upper part of the outer lateral faces of the first wavelength converting member 3 disposed on the lateral faces of the light emitting element 1, the light emitted by the first phosphor contained in the first wavelength converting member 3 can be readily extracted without being reflected or absorbed by the second phosphor.

Furthermore, by arranging the second phosphor to be localized in the vicinity of the light emitting element 1 and the lead electrodes 21 and 22 which have higher thermal conductivity than the base resin material of the second wavelength converting member 4, the heat generated by the second phosphor in association with Stokes losses can be efficiently dissipated to the outside.

The portion having a low concentration of the second phosphor can be defined, for example, as a portion having a second phosphor concentration that is at most one half the concentration at the height of the lower face of the light emitting element 1. The high-concentration portion 4a can be defined as a portion having a second phosphor concentration that is at least one half the concentration at the height of the lower face of the light emitting element 1.

The arrangement of the second phosphor particles can be specified by the area ratio of the second phosphor particles in the second wavelength converting member 4 in lieu of the definition based on the concentration described above.

Specifically, in a cross-sectional area of the second wavelength converting member 4 cut from the upper face to the lower face, a first area ratio, which is the percentage of the area in the height range of from the upper face to one half of the height of the light emitting element 1 that is occupied by the cross sections of the second phosphor particles, can be set smaller than a second area ratio, which is the percentage of the area in the height range of from one half of the height of the light emitting element 1 to the upper face of the base 2 that is occupied by the cross sections of the second phosphor particles.

Here, the cross-sectional areas of the second wavelength converting member 4 referenced to determine the first area ratio and the second area ratio can be the entire strip-shaped cross-sectional areas respectively corresponding to the height ranges described above. In other words, the first area ratio and the second area ratio are each determined by the percentage of the entire cross-sectional area in the applicable height range that is occupied by the cross sections of the second phosphors across. By using the entire cross-sectional area in the applicable height range as a referenced area, the effect of the second phosphor on the extraction of the light emitted by the first phosphor can be adequately assessed even if there are irregularities in the distribution of the second phosphor particles in the lateral direction.

The areas referenced to determine the first area ratio and the second area ratio may be partial cross-sectional areas in the respective height ranges instead of the entire cross-sectional areas. A partial reference area can be a rectangular area extending from one side of the light emitting element 1 to the distance equivalent to the height of the light emitting element 1. In other words, the first area ratio and the second area ratio are determined by the respective percentages of the rectangular areas in the corresponding height ranges that are occupied by the cross sections of the second phosphor particles. In determining the first area ratio and the second area ratio, since the lateral face of the light emitting element 1 is covered by the first wavelength converting member 3, each cross-sectional area of the second wavelength converting member 4, which is what remains after excluding the area occupied by the first wave converting member 3, is used for the comparison.

For example, in the case where the height of the light emitting element 1 is 200 μm, each of the cross-sectional areas of the second wavelength converting member 4 to be referenced to determine the first area ratio and the second area ratio is an area in the vicinity of a lateral face of the light emitting element 1, preferably adjacent to an outer lateral face of the first wavelength converting member 3, which is a rectangular area of 100 μm in height and 200 μm in width extending from a side of the light emitting element 1 perpendicularly to the lateral face of the light emitting element 1. The area used for determining the second area ratio is between the bottom face of the recessed portion 23a of the package 2 and 100 μm in height, and the area used for determining the first area ratio is between 100 μm in height and 200 μm in height which is the upper face of the light emitting element 1.

By using the areas in the vicinity of a lateral face of the light emitting element 1 as the areas referenced to determine the first and second area ratios, the effect of the second phosphor on the extraction of the light from the first phosphor contained in the first wavelength converting member 3 can be more adequately assessed.

Furthermore, the reference areas used for determining the first area ratio and the second area ratio can each be a prescribed area having a given shape in the applicable height range that is in the vicinity of the light emitting element 1 which is provided with the first wavelength converting member 3. The shape of the prescribed area can be, for example, a circle, a square, or any other polygon. The size of the area can be determined in accordance with the particle size of the second phosphor. For example, in the case of using a square or circular shape for the prescribed area, the length of each side of the square or the diameter of the circle is preferably set to at least four times the average particle size or the D50 value, which is the median, of the second phosphor. Alternatively, the reference area can be an area which contains at least 10 particles of the second phosphor.

The lower the first area ratio, the more successful extraction of the light emitted by the first phosphor 1 can result. Moreover, the smaller the first area ratio than the second area ratio, the more successful extraction of the light emitted by the first phosphor 1 can result.

Specifically, the first area ratio is preferably 50% at most. The first area ratio is preferably a half of the second area ratio at most. Particularly, the first area ratio is more preferably 40% at most, even more preferably 20% at most. The first area ratio is more preferably set to two fifths of the second area ratio.

The second wavelength converting member 4 can be formed using a light transmissive resin material containing the second phosphor particles. For the resin material, it is preferable to use a material which has good transmittance for the light emitted by the first and second phosphors, and is weather resistant, light resistant, and heat resistant to serve as a sealing member. For such a material, any of those used for the resin portion 23 of the package 2 described earlier can be used. Furthermore, it is preferable to employ a thermosetting resin for the resin material in order to arrange the second phosphor particles at high concentration on the bottom face 23b of the recessed portion 23a by allowing the second phosphor particles to settle in the manufacturing process described later. Accordingly, silicone resins and fluororesins which are highly heat resistant and light resistant are particularly preferable.

For the first phosphor and the second phosphor, which are wavelength converting substances, any substance that is known in the art can be used. They can be suitably selected from the phosphors listed below, for example, by taking into consideration the peak emission wavelengths of the light emitting element 1, the first phosphor, and the second phosphor, as well as the emission color of the light emitting device 100.

In the case where the light emitting element 1 emits blue light, for example, a light emitting device 100 which emits white light can be constructed by having the first wavelength converting member 3 contain a first phosphor that converts blue light into red light, and having the second wavelength converting member 4 contain a second phosphor that converts blue light into green-yellow light.

For both or either one of the first and second phosphors, two or more fluorescent materials may be used.

Examples of the wavelength converting substances include cerium-activated yttrium aluminum garnet (YAG)-based phosphors which emit green to yellow light; cerium-activated lutetium aluminum garnet (LAG)-based phosphors which emit green light; europium- and/or chromium-activated nitrogen-containing calcium aluminosilicate (CaO—$Al_2O_3$—$SiO_2$)-based phosphors which emit green to red light; europium-activated silicate (($Sr,Ba)_2SiO_4$)-based phosphors which emit blue to red light; β-SiAlON phosphors having a composition expressed as $(Si,Al)_6(O,N)_8:Eu$, and sulfide-based phosphor having a composition expressed as $SrGa_2S_4:Eu$, which emit green light; nitride-based phosphors, such as CASN-based phosphor having a composition expressed as $CaAlSiN_3:Eu$, and SCASN-based phosphors having a composition expressed as $(Sr,Ca)AlSiN_3:Eu$, which emit red light; fluoride-based phosphors such as KSF-based phosphor having a composition expressed as $K_2SiF_6:Mn$ which emit red light; sulfide-based phosphors which emit red light; and germinate-based (MGF-based) phosphors having a composition expressed as $(3.5MgO0.5MgF_2GeO_2:Mn)$ which emit red light.

For the first phosphor and the second phosphor, it is preferable to employ those having an average particle size of from about 1 µm to about 40 µm, more preferably from about 5 µm to about 30 µm. By setting the average particle size for the first and second phosphors to such a range, the particles can be arranged at high density while maintaining the luminance.

Furthermore, the second phosphor preferably reflect the light from the first phosphor at the peak emission wavelength. Here, the reflectance of the second phosphor for the peak emission wavelength of the first phosphor is preferably at least 60%, more preferably at least 70%, and even more preferably at least 80%.

By employing a substance for the second phosphor which adequately reflects the light emitted by the first phosphor, the light emitted by the first phosphor can be efficiently extracted.

The explanation of light extraction will be discussed in detail later.

Figure 3:
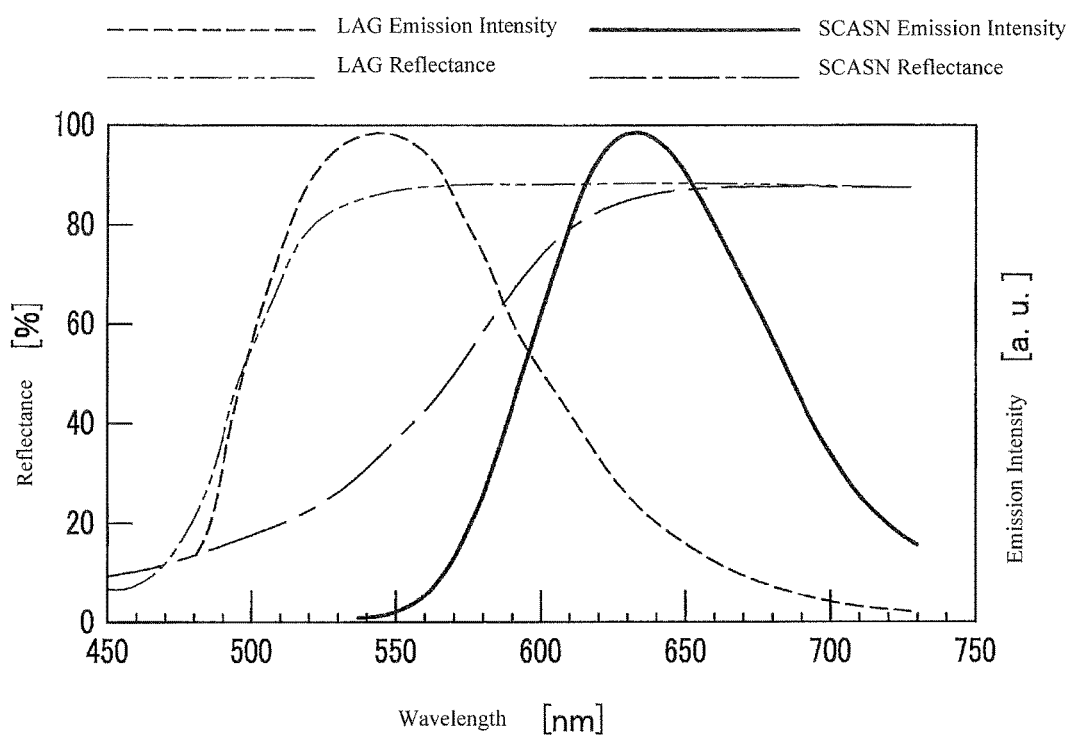
FIG. 3 is a graph showing the emission spectra of the phosphors by way of example used in the light emitting device according to the embodiment.

Combinations of the first phosphor and the second phosphor will be explained here with reference to FIG. 3. FIG. 3 is a graph showing the emission and reflection spectra of the examples of phosphors used in the light emitting device in the present embodiment.

In FIG. 3, the emission and reflection spectra of the SCASN-based phosphor are shown using a continuous line and a long dashed dotted line, respectively, and the emission and reflection spectra of the LAG-based phosphor are shown using a dashed line and a long dashed double-dotted line, respectively.

The SCASN-based phosphor emits red light of a peak emission wavelength in the vicinity of 630 nm and, and the LAG-based phosphor emits green light of a peak emission wavelength in the vicinity of 540 nm.

The SCASN-based phosphor, a red phosphor, demonstrates a relatively high degree of absorption for the light emitted by the LAG-based phosphor in addition to the blue light emitted by the light emitting element 1, which are on the shorter wavelength side of the emission wavelength thereof. In contrast, the LAG-based phosphor, a green phosphor, has a high reflectance for the light emitted by the SCASN-based phosphor over the entire band of wavelengths.

Accordingly, by using the SCASN-based phosphor for the first phosphor, using the LAG-based phosphor for the second phosphor, and arranging the first wavelength converting member 3 and the high-concentration portion 4a of the second wavelength converting member 4 so as to reduce the amount of light emitted by the second phosphor to be irradiated against the first phosphor, the red light from the first phosphor as well as the green light from the second phosphor can be efficiently extracted.

The extraction of light from the light emitting device 100 will be discussed in detail later.

The second wavelength converting member 4 may contain a light diffusing substance. Specifically, particles of a white pigment such as $TiO_2$, $Al_2O_3$, or the like can be used for the light diffusing substance to be contained in the second wavelength converting member 4. Among all, $TiO_2$ is preferable because it is relatively stable against moisture, and has a high refractive index and high thermal conductivity.

The average particle size of the particles of the light diffusing substance contained in the second wavelength converting member 4 is preferably in the range of from 0.001 µm to 10 µm, which can achieve a high light scattering efficiently. Particularly, the average particle size of the particles of the light diffusing substance contained in the second wavelength converting member 4 is more preferably in the range of from 0.001 µm to 0.05 µm. This can achieve a high light scattering effect, i.e., Rayleigh scattering effect, thereby further increasing the light extraction efficiency of the light emitting device 100. Moreover, the amount of phosphor can be reduced proportionally to the increase achieved in the light extraction efficiency, which can moderate the temperature increase caused by the heat generated by the phosphor. This can reduce the deterioration of the phosphor, thereby improving the reliability of the light emitting device 100.

Wires 5 electrically connect the external connection part 13a of the n-side electrode 13 and the external connection part 142a of the p-side electrode 14 to the respective lead electrodes 21 and 22 of the corresponding polarities. A wire 5 is also used to electrically connect one of the electrodes of the protective device 6 to the lead electrode 21.

For the wires 5, Au, Cu, Al, Ag, or an alloy having any of these metals as the main component can suitably be used.

A protective device 6 is preferably disposed to protect the light emitting element 1 from electrostatic discharge. For the protective device 6, a Zener diode can be used, which is connected to the light emitting element 1 in parallel and in the opposite polarity. A varistor, resistor, or capacitor can alternatively be used as the protective device 6.

The protective device 6 is bonded on the lead electrode 22 using a conductive bonding member 72 where one of the electrodes of the protective device 6 is electrically connected. The other electrode of the protective device 6 is connected to the lead electrode 21 using a wire 5.

The bonding member 71 is a light transmissive bonding material used to bond the light emitting element 1 to the lead electrode 21 disposed at the bottom face 23b of the recessed portion 23a.

It is preferable to use for the bonding member 71 a resin material which is not susceptible to discoloration or deterioration that could be caused by the light emitted or heat generated by the light emitting element 1. It is further preferable for the resin material to have a good light transmittance, and a refractive index equivalent to or lower than that of the resin material used in the second wavelength converting member 4. By using a bonding member 71 having a refractive index equivalent to or lower than that of resin material used in the second wavelength converting member 4, the light entering the bonding member 71 can be efficiently extracted without allowing for total internal reflection to occur at the interface between the bonding member 71 and the second wavelength converting member 4. For such a resin material, a silicone-based die bonding resin having a siloxane scaffold is preferable. Examples of silicone-based die bonding resins include silicone resins, silicone hybrid resins, and silicone modified resins.

The bonding member 72 is a conductive bonding material such as solder for bonding the protective device 6 to the lead electrode 22, and electrically connecting one of the electrodes of the protective device 6 to the lead electrode 22.
Variations In the present embodiment, a resin package was used as the base for mounting the light emitting element 1, but a ceramic package can alternatively be used.

Moreover, a package 2 having a recessed portion 23a was used for the base, but the base can be a flat sheet base without a recessed portion 23a.

Operation of the Light Emitting Device

The operation of the light emitting device 100 will be explained next with reference to FIGS. 1A-1C, and FIG. 4A and FIG. 4B.

Figure 4A:
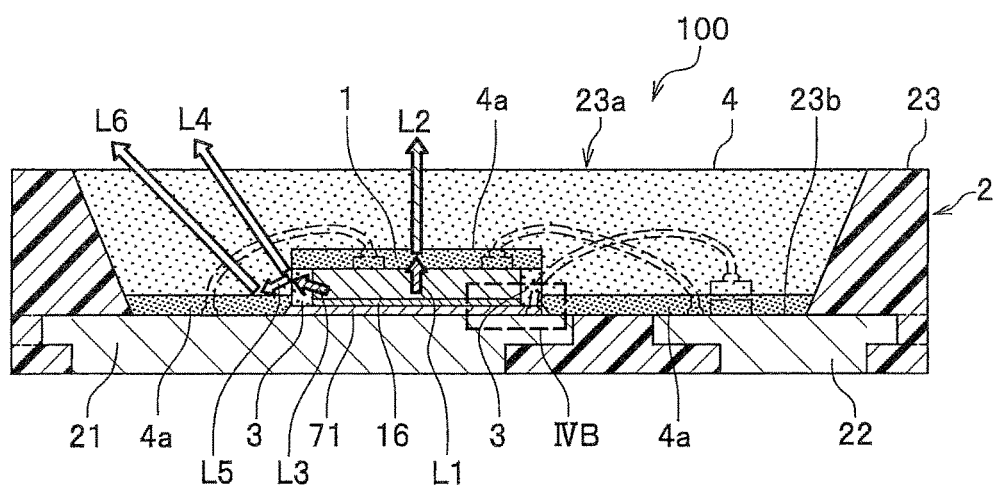
FIG. 4A is a diagram explaining how light is extracted from the light emitting device according to the embodiment.
Figure 4B:
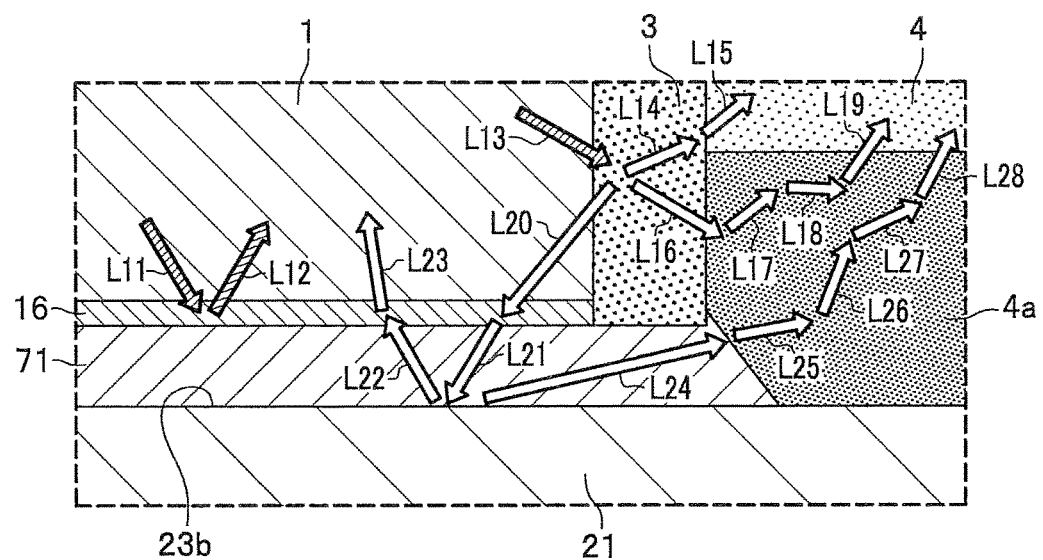
FIG. 4B is a diagram explaining how light is extracted from the light emitting device according to the embodiment, which is an enlargement of the portion VIB in FIG. 4A.

FIG. 4A is a diagram explaining the extraction of light from the light emitting device related to the present embodiment. FIG. 4B is an enlarged view of the area IVB in FIG. 4A explaining the extraction of light from the light emitting device related to the present embodiment.

For explanation purposes, it is assumed that the light emitting element 1 emits blue light, the first wavelength converting member 3 contains, as a wavelength converting substance, particles of a first phosphor that absorb blue light and emit red light, and the second wavelength converting member 4 contains, as a wavelength converting substance, particles of a second phosphor that absorb blue light and emit green light. It is also assumed that the reflective film 16 has the reflective properties of reflecting the blue light emitted by the light emitting element 1, while transmitting the red light emitted by the first phosphor contained in the first wavelength converting member 3.

In the light emitting device 100, when connected to an external power supply via the lead electrodes 21 and 22, and electrical current is supplied to the light emitting element 1 via wires 5, the light emitting element 1 emits blue light. Among the rays of blue light emitted from the light emitting element 1, an upward propagating ray L1 is converted into green light by the second phosphor in the high-concentration portion 4a of the second wavelength converting member 4 disposed on the upper face of the light emitting element 1, and extracted as ray L2 from the upper face of the light emitting device 100.

In the light emitting device 100 according to the present embodiment, the high-concentration portion 4a which contains the second phosphor at high concentration is not provided with a first wavelength converting member 3 containing the first phosphor on the upper face side, which is the light extraction face of the light emitting device 100. For this reason, the blue light released from the upper face of the light emitting element 1 can be efficiently converted into green light and extracted.

Blue ray L3 laterally propagating in the light emitting element 1 is converted into red light by the first phosphor contained in the first wavelength converting member 3 disposed on the lateral faces of the light emitting element 1. A portion of the red light, such as that indicated by ray L4, propagates in the portion of the second wavelength converting member 4 having a low concentration of the second phosphor towards the top and is extracted.

In the light emitting device 100 according to the present embodiment, because the portion of the second wavelength converting member 4 having a low concentration of the second phosphor is provided at one portion of the external lateral face of the first wavelength converting member 3, the red light converted by the first phosphor can be efficiently extracted.

Another portion of the red light, a downward propagating ray L5, is reflected by the second phosphor contained in the high-concentration portion 4a on the bottom face 23b of the recessed portion 23a. The reflected light, ray L6, propagates upwardly in the second wavelength converting member 4 and is extracted.

In the light emitting device 100 according to the present embodiment, because the second phosphor is a material having a high reflectance for the red light emitted by the first phosphor, the high-concentration portion 4a disposed on the bottom face 23b of the recessed portion 23a functions as a reflective layer for the light emitted by the first phosphor. Thus, the red light emitted by the first phosphor can be efficiently extracted.

Among the rays of blue light emitted by the light emitting element 1, a downward propagating ray L11 is reflected by the reflective film 16 disposed at the bottom face of the light emitting element 1, and propagates upwardly shown as ray L12.

Among the rays of blue light emitted by the light emitting element 1, a laterally propagating ray L13 is converted into red light by the first phosphor contained in the first wavelength converting member 3. Among the rays of red light, ray L14 which propagates towards the portion of the second wavelength converting member 4 having a low concentration of the second phosphor propagates as ray L15 in the second wavelength converting member 4 and is extracted.

Among the rays of red light, ray L16 which propagates towards the high-concentration portion 4a of the second wavelength conversion member 4 propagates in the portion while being scattered by the second phosphor particles contained in the high-concentration portion 4a as rays L17, L18, and L19, further propagates in the portion of the second wavelength converting member 4 having a low concentration of the second phosphor, and then extracted. Here, using as the second phosphor a material having a high reflectance for red light allows for the red light to propagate while being scattered, but moderating the decline in the amount of light, and be extracted.

Among the rays of red light, a downward propagating ray L20 which enters the light emitting element 1 transmits through the reflective film 16 and enters the bonding member 71. A downward propagating ray L21 in the bonding member 71 is reflected by the upper face of the lead electrode 21 disposed at the bottom face 23b of the recessed portion 23a, and propagates upwardly as ray L22 shown. Ray L22 transmits through the reflective film 16 and propagates upwardly in the light emitting element 1 as ray L23, and is extracted from the upper face side of the light emitting element 1.

A portion of the red light entering the bonding member 71, as shown by ray L24, propagates laterally in the bonding member 71, enters the high-concentration portion 4a of the second wavelength converting member 4 disposed on the bottom face 23b of the recessed portion 23a, propagates while being scattered by the second phosphor particles as shown by rays L25, L26, L27, and L28, propagates in the upper layer portion of the second wavelength converting member 4 having a low concentration of the second phosphor, and is extracted.

By adding a path for extracting red light, which is a path via the bonding member 71, described above, the amount of red light in the output light of the light emitting device 100 can be increased. This can improve the color rendering quality of the light emitting device 100 particularly with respect to the red color chart.

A portion of the blue light entering the first wavelength converting member 3 disposed on the lateral faces of the light emitting element 1 and the high-concentration portion 4a of the second wavelength converting member 4 disposed on the upper face of the light emitting element 1 transmits through the first wavelength converting member 3 and the high-concentration portion 4a of the second wavelength converting member 4 without undergoing wavelength conversion.

A portion of the blue light that has transmitted through the first wavelength converting member 3 and the high-concentration portion 4a of the second wavelength converting member 4 is extracted from the light emitting device 100 as blue light. Another portion of the blue light is reflected by the interface of the members provided in the recessed portion 23a, converted into green light by the second phosphor contained in the high-concentration portion 4a disposed on the bottom face 23b of the recessed portion 23a, and is extracted.

A portion of the green light emitted from the high-concentration portion 4a of the second wavelength converting member 4 enters the first wavelength converting member 3 and is converted into red light, but in the light emitting device 100 according to the present embodiment, the first wavelength converting member 3 and the high-concentration portion 4a of the second wavelength converting member 4 are disposed so that the area where they are in contact with one another is small. For this reason, the decline in the green light component resulting from the conversion of green light into red light can be moderated.

As explained above, the blue light emitted by the light emitting element 1 is such that a portion is extracted as is, a portion is extracted after being converted into red light by the first phosphor in the first wavelength converting member 3, and a portion is extracted after being converted into green light primarily by the second phosphor in the high-concentration portion 4a of the second wavelength converting member 4. White light resulting from mixing these rays of light is output by the light emitting device 100.

At this point, the color rendering quality of the light emitting device 100 can be improved because the red light emitted by the first phosphor can be efficiently extracted. Moreover, the output of the light emitting device 100 can be increased because the green light emitted by the second phosphor can be efficiently extracted.

Method for Manufacturing the Light Emitting Device

Next, a method for manufacturing the light emitting device 100 will be explained with reference to FIGS. 5-8B.

Figure 5:
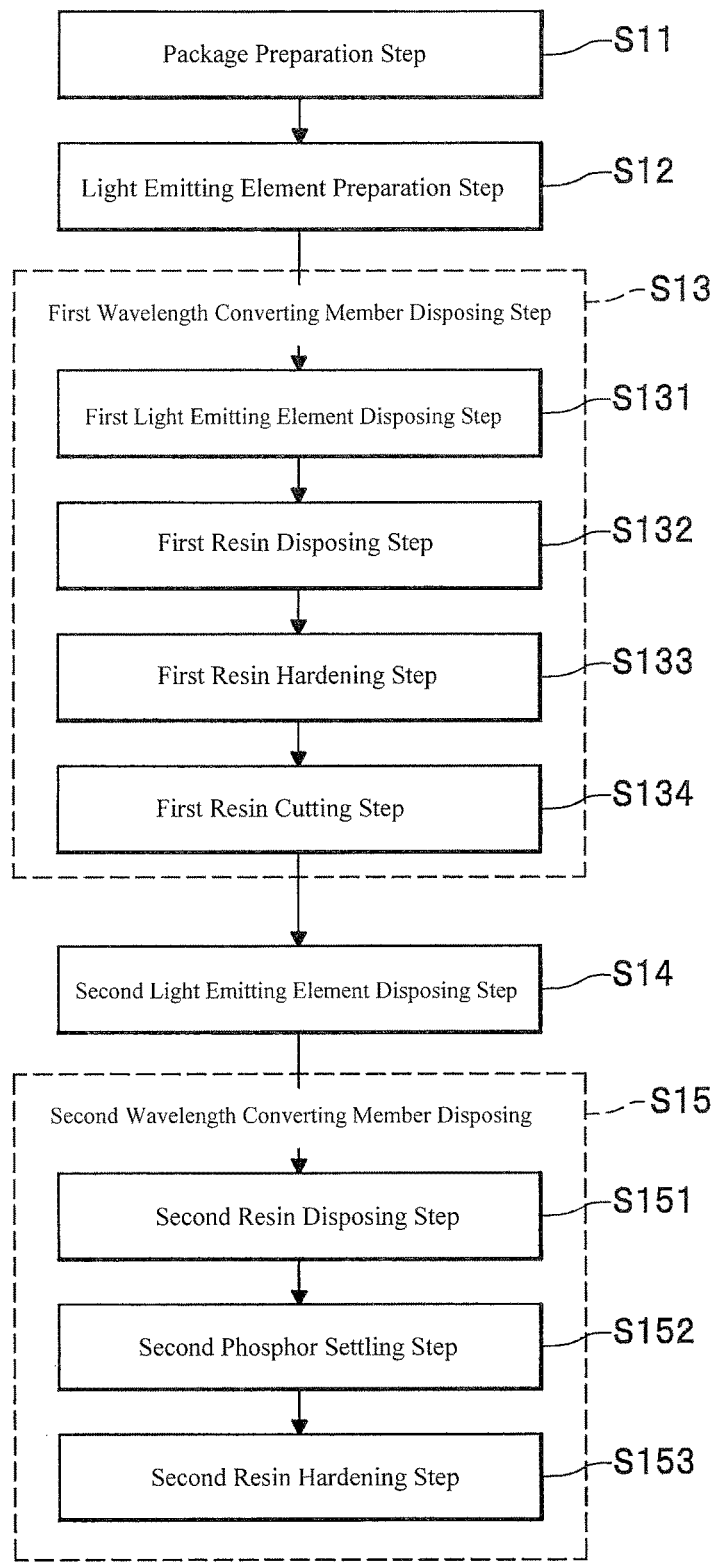
FIG. 5 is a flowchart showing the steps in the method for manufacturing the light emitting device according to the embodiment.
Figure 6A:
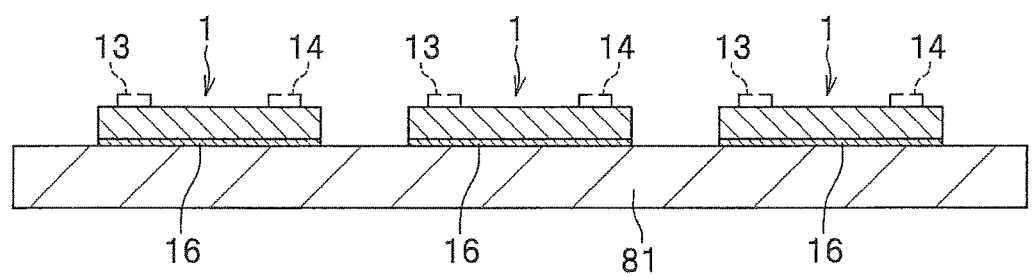
FIG. 6A is a cross-sectional view showing a first light emitting element disposing step in a first wavelength converting member disposing step in the method for manufacturing the light emitting device according to the embodiment.
Figure 6B:
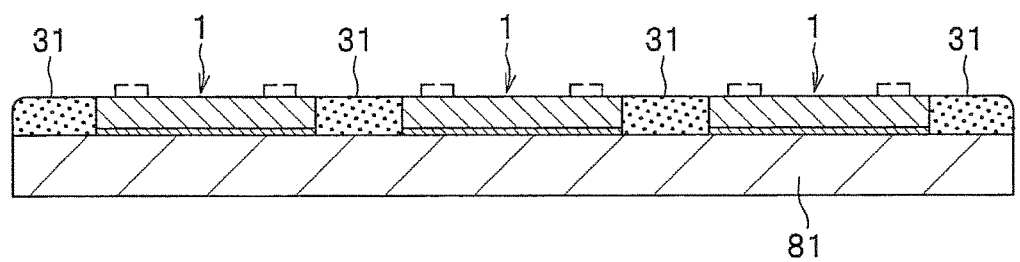
FIG. 6B is a cross-sectional view showing a first resin disposing step in the first wavelength converting member forming step in the method for manufacturing the light emitting device according to the embodiment.
Figure 6C:
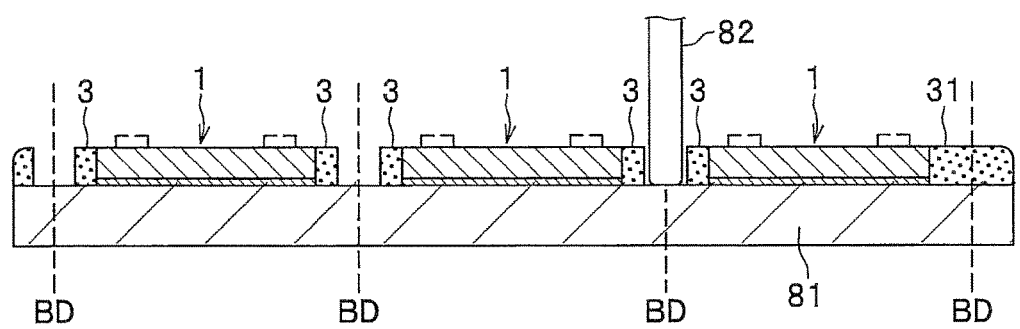
FIG. 6C is a cross-sectional view showing a first resin cutting step in the first wavelength converting member forming step in the method for manufacturing the light emitting device according to the embodiment.
Figure 7:
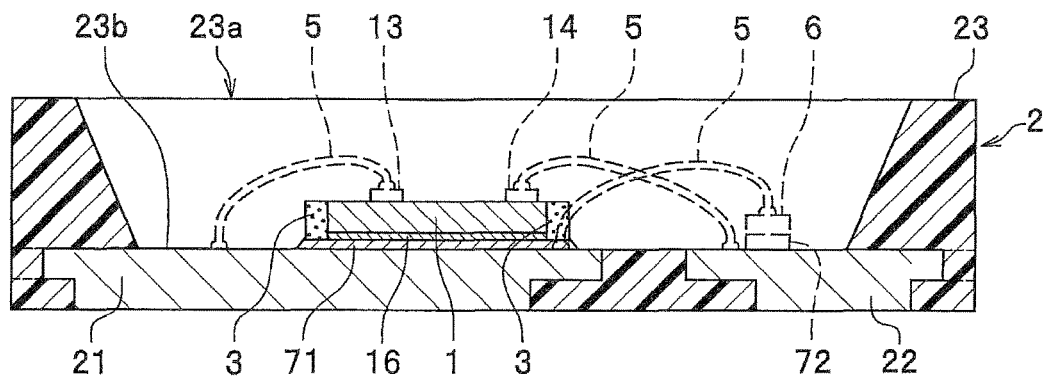
FIG. 7 is a cross-sectional view showing a second light emitting element disposing step in the method for manufacturing the light emitting device according to the embodiment.
Figure 8A:
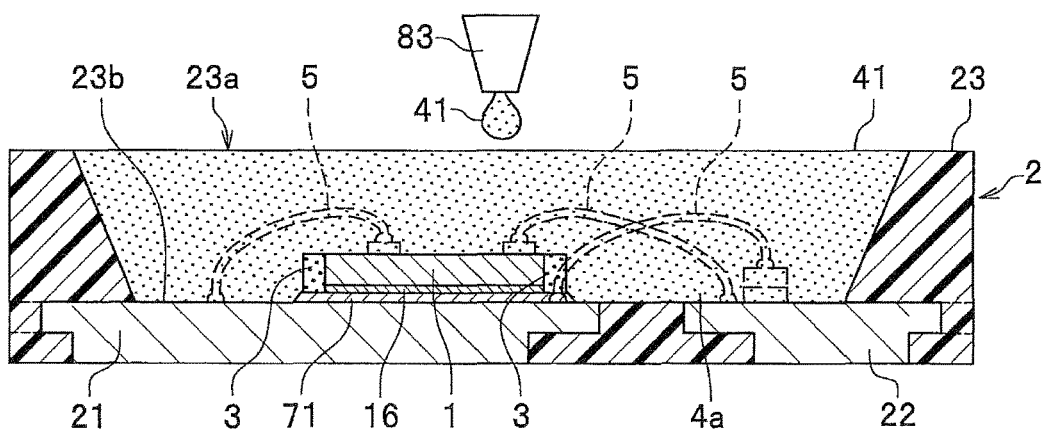
FIG. 8A is a cross-sectional view showing a second resin disposing step in a second wavelength converting member forming step in the method for manufacturing the light emitting device according to the embodiment.
Figure 8B:
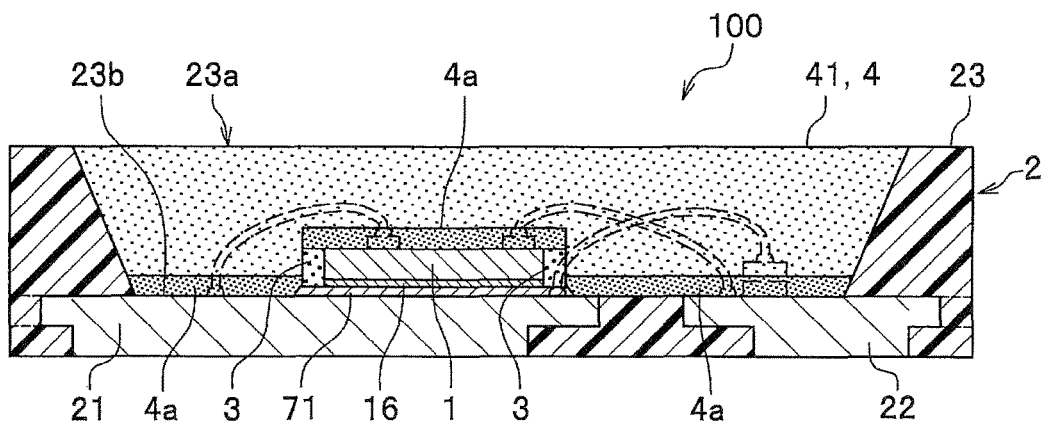
FIG. 8B is a cross-sectional view showing a second phosphor settling step in the second wavelength converting member forming step in the method for manufacturing the light emitting device according to the embodiment.

FIG. 5 is a flowchart showing the steps in the method for manufacturing the light emitting device according to the present embodiment. FIG. 6A is a cross-sectional view showing a first light emitting element disposing step in a first wavelength converting member forming step in the method for manufacturing the light emitting device according to the embodiment. FIG. 6B is a cross-sectional view showing a first resin disposing step in the first wavelength converting member forming step in the method for manufacturing the light emitting device according to the embodiment. FIG. 6C is a cross-sectional view showing a first resin cutting step in the first wavelength converting member forming step in the method for manufacturing the light emitting device according to the embodiment. FIG. 7 is a cross-sectional view showing a second light emitting element disposing step in the method for manufacturing the light emitting device according to the embodiment. FIG. 8A is a cross-sectional view showing a second resin disposing step in a second wavelength converting member forming step in the method for manufacturing the light emitting device according to the embodiment. FIG. 8B is a cross-sectional view showing a second phosphor settling step in the second wavelength converting member forming step in the method for manufacturing the light emitting device according to the embodiment.

FIGS. 7-8B are sectional views at the locations corresponding to line IC-IC in FIG. 1B.

The method for manufacturing the light emitting device 100 according to the present embodiment includes a package preparation step S11, a light emitting element preparation step S12, a first wavelength converting member forming step S13, a second light emitting element disposing step S14, and a second wavelength converting member forming step S15. The first wavelength converting member forming step S13 includes a first light emitting element disposing step S131, a first resin disposing step S132, a first resin hardening step S133, and a first resin cutting step S134. The second wavelength converting member forming step S15 includes a second resin disposing step S151, a second phosphor settling step S152, and a second resin hardening step S153.

The package preparation step (step of preparing a base) is a step of preparing the package 2 which is the base in the light emitting device 100. The package 2 prepared in this step is in the state where none of the light emitting element 1, the first wavelength converting member 3, and the second wavelength converting member 4 is disposed.

In the package preparation step S11, a package 2 can be prepared, for example, by way of a molding method involving dies, such as transfer molding, injection molding, compression molding, or extrusion molding, or a commercially available package may be obtained.

An example of the method of manufacturing a package 2 will be explained.

First, a lead frame having the outer shapes of the lead electrodes 21 and 22 are forming by blanking a piece of sheet metal. Next, the lead frame is interposed between upper and lower dies having a void in the shape of a resin portion 23, and a resin material is injected through a gate hole provided in the mold. Next, the injected resin material is cured or hardened, and the molded piece is removed from the dies. By performing the steps described above, the package 2 can be manufactured. In the case where a plurality of packages 2 are produced in the state of being linked together by the lead frame, the packages 2 are divided into individual pieces by cutting the lead frame.

The packages 2 may alternatively be divided into individual pieces after the second wavelength converting member forming step S15.

The light emitting element preparation step S12 is a step of preparing individually divided light emitting elements 1.

The first wavelength converting member forming step S13 is a step of providing the first wavelength converting member 3 so as to cover the lateral faces of the light emitting element 1 prepared in the light emitting element preparation step S12. As described earlier, the first wavelength converting forming step S13 includes a first light emitting element disposing step S131, a first resin disposing step S132, a first resin hardening step S133, and a first resin cutting step S134.

The first light emitting element disposing step S131 is a step of disposing a light emitting element 1 on the support material 81. The support material 81 is a flat sheet base, which is constructed so as not to allow the light emitting element 1 to fall off the support material 81 while performing the first resin disposing step S132 through the first resin cutting step S134.

For this purpose, an adhesive layer can be provided on the upper face of the support material 81 to hold the light emitting element 1 on the upper face using adhesive force. By using a thermosetting resin or UV curable resin as the adhesive layer, the light emitting element 1 provided with a first wavelength converting member 3 can be easily separated from the support material 81 after forming the first wavelength converting member 3 followed by curing the adhesive layer by heating or irradiating with UV to eliminate the adhesive force.

In the present embodiment, a plurality of light emitting elements 1 are disposed at prescribed intervals on the support material 81. Here, prescribed intervals are determined by taking into consideration the width of the first wavelength converting member 3 to be disposed, i.e., the thickness in the direction perpendicular to the lateral faces of the light emitting elements 1, and the widths of the cutting margins used in the first resin cutting step S134.

In the present embodiment, a plurality of light emitting elements 1 are disposed on the support material 81, but a single light emitting element 1 may be disposed instead.

The first resin disposing step S132 is a step of disposing a first resin 31 containing a first phosphor particles so as to cover the lateral faces of the light emitting elements 1 arranged on the support material 81.

For the first resin 31, a thermosetting resin is preferably used as the resin material which is the base material. The first resin 31 can be disposed on the upper face side of the support material 81 by applying a slurry containing an uncured thermosetting resin and particles of a first phosphor by using a coating method. Here, the viscosity of the slurry to be applied can be adjusted to that suited for the coating method used by adjusting the amounts of the solvent and filler such as silica.

Examples of slurry coating methods include spraying, silk screen printing, inkjetting, potting, and spin coating. Among all, spin coating is convenient for filling between the light emitting elements 1 without coating the upper faces of the light emitting elements 1 with the slurry.

The first resin hardening step S133 is a step of hardening the first resin 31.

A thermoplastic resin can alternatively be used as the first resin 31. In this case, in the first resin disposing step S132, the first resin 31 containing the first phosphor is melted and disposed on the lateral faces of the light emitting element 1. Subsequently, the first resin 31 is hardened in the first resin hardening step S133 by letting it cool down naturally or cooling it by some means.

The first resin cutting step S134 is a step of cutting the first resin 31 along the border lines BD set between the light emitting elements 1. Specifically, the first resin 31 is cut along the border lines BD by forming grooves penetrating in the thickness direction using a dicer 82 or the like. At this time, the first resin 31 is cut so as to leave a prescribed width from each lateral face of the light emitting element 1. The first resin 31 remaining on the lateral faces of the light emitting element 1 becomes the first wavelength converting member 3.

The light emitting element 1 provided with the first wavelength converting member 3 formed in the above step is used after it is separated from the support material 81.

Either of the step of forming a light emitting element 1 provided with a first wavelength converting member 3, which includes the light emitting element preparation step S12 and the first wavelength converting member forming step S13, and the package preparation step S11 may be performed first, or they may be performed in parallel.

The second light emitting disposing step S14 is a step of mounting the light emitting element 1 provided with the first wavelength converting member 3 inside the recessed portion 23a of the package 2, which is the base. First, the light emitting element 1 provided with the first wavelength converting member 3 is bonded on the lead electrode 21 which partly forms the bottom face 23b of the recessed portion 23a of the package 2 by using a light transmissive bonding member 71. At this time, the light emitting element 1 provided with the first wavelength converting member 3 is bonded to the bottom face 23b of the recessed portion 23a facing the reflective film 16 side down.

Then, the n-side electrode 13 and the p-side electrode 14 of the light emitting element 1 are electrically connected to the lead electrodes 21 and 22 of the corresponding polarities using wires 5. In this step, moreover, the protective device 6 is also installed in the recessed portion 23a of the package 2 using a bonding member 72 and a wire 5.

The second wavelength converting member forming step S15 is a step of disposing a second wavelength converting member 4 to cover the upper and lateral faces of the light emitting element 1 provided with the first wavelength converting member 3. As described earlier, the second wavelength converting member forming step S15 includes a second resin disposing step S151, a second phosphor settling step S152, and a second resin hardening step S153.

The second resin disposing step S151 is a step of disposing a second resin 41 containing a second phosphor to cover the upper and lateral faces of the light emitting element 1 provided with the first wavelength converting member 3.

For the second resin 41, a thermosetting resin is used as the resin material which is the base material. A slurry containing the second phosphor particles and the resin material is prepared, the viscosity of which is adjusted using a solvent, and a filler as needed. The slurry is supplied to fill the recessed portion 23a using a dispenser 83.

For the second phosphor, one having a higher specific gravity than that of the uncured resin material is used.

The second phosphor settling step S152 is a step of holding the second resin 41 supplied to the recessed portion 23a of the package 2 in an uncured state and settling the second phosphor particles towards the bottom face 23b of the recessed portion 23a. Settling the second phosphor particles towards the bottom face 23b of the recessed portion 23a refers to settling the particles on the bottom face 23b, as well as settling the particles on the upper face of the light emitting element 1 provided with the first wavelength converting member 3 in the area where the light emitting element 1 provided with the first wavelength converting member 3 is disposed. As the second phosphor particles settle, a high-concentration portion 4a containing the second phosphor at relatively high concentration is formed within the second wavelength converting member 4.

As described earlier, since the specific gravity of the second phosphor is higher than that of the uncured resin material, the second phosphor settles to the bottom which is in the direction of gravity. Accordingly, the second phosphor is allowed to settle naturally by letting the second resin 41 stand uncured.

Moreover, the particles of the second phosphor may be forcibly settled towards the bottom face 23b of the recessed portion 23a using a centrifuge. At this time, the package 2 with an uncured second resin 41 disposed therein is set in a centrifuge so that the centrifugal force is applied downwardly perpendicular to the bottom face 23b.

By forcibly settling the second phosphor particles using a centrifuge, the time required for the step can be reduced as compared to the case where the particles settle naturally.

Furthermore, forcible settling can highly densely arrange the second phosphor particles in a thinner layer portion near the bottom face 23b than natural settling. In other words, the portion of the second resin in which the second phosphor particles are not arranged or arranged at a low concentration can be increased at the upper lateral faces of the first wavelength converting member 3. This, as a result, can increase the efficiency of extracting the light whose wavelength has been converted by the first wavelength converting member 3.

The second resin hardening step S153 is a step of hardening the second resin 41 by heating after the second phosphor particles have settled. This completes the second wavelength converting member 4.

The light emitting device 100 can be manufactured by the steps explained above.

Variations

As described earlier, the light emitting device may be constructed with a base which does not have a recessed portion 23a. In this case, the device can be produced by placing a frame to surround the light emitting element 1 provided with the first wavelength converting member 3 when viewed from the top in the second wavelength converting member forming step S15, and removing the frame after forming the second wavelength converting member 4 by dispensing an uncured second resin 41 in the frame, allowing the second phosphor particles to settle, and hardening the second resin 41.

Alternatively, it can be formed without using a frame. In this case, the second resin 41 whose viscosity has been suitably adjusted is dripped to cover the light emitting element 1 provided with the first wavelength converting member 3 by potting and is hardened after allowing the second phosphor particles to settle naturally.

EXAMPLES

Example 1

Light emitting devices having the shape shown in FIGS. 1A-1C were produced as Example 1 and Comparative Example 1 under the conditions described below. For each of the light emitting device produced, the luminous flux, as well as the average color rendering index Ra and the special color rendering index R9 for the red color chart as specified by the Japanese Industrial Standards HS Z8726: 1990 were measured.

Production Conditions
Light Emitting Element
  Plan view shape: Square, 650 µm per side
  Thickness: 200 µm
  Semiconductor material: Nitride gallium-based semiconductor
  Substrate: Sapphire
  Peak emission wavelength: 448 nm
  Reflective film: DBR film (the layer in contact with the sapphire substrate is $SiO_2$, 21 layers of alternately stacked $SiO_2$ and $Nb_2O_5$)
  The DBR film has a reflectance of 98%, design value, against the peak emission wavelength of the light emitting element at an incident angle of 0°, and a reflectance of 81%, design value, against the peak emission wavelength of the first phosphor at an incident angle of 0°.

Package
  A package manufactured by Nichia Corporation, Model No. NFxW757G, was used. The major specifications are described below.
  Plan view shape: Outer shape is a square, 3.0 mm per side. The opening of the recessed portion is substantially a square, 2.6 mm per side.
  Resin portion: White resin
  Lead electrode: Provided with a reflective film of Ag plating on the upper surface
  Bonding member for light emitting element (die bonding resin): dimethyl-based silicone resin
  First Wavelength Converting Member
  Base material: silicone resin (product name SCR-1011 manufactured by Shin-Etsu Chemical Co., Ltd.), refractive index 1.53
  First phosphor: SCASN-based phosphor (peak emission wavelength: 620 nm), average particle size 10 µm
  First phosphor content: 100 parts by mass to 100 parts by mass of the base material
  Second Wavelength Converting Member
  Base material: phenyl-based silicone resin (product name OE-6630 manufactured by Dow Corning Toray Co., Ltd.), refractive index 1.53
  Second phosphor: LAG-based phosphor (peak emission wavelength: 517 nm), average particle size 22 µm
  Second phosphor content: 60 parts by mass to 100 parts by mass of the base material Light diffusing agent: 18.2 parts by mass to 100 parts by mass of the base material
  The second phosphor was allowed to settle naturally when the second wavelength converting member was formed.

Comparative Example 1: Conditions Different from Those for Example 1

Phosphor corresponding to the first phosphor: SCASN-based phosphor (peak emission wavelength: 625 nm). In order to match the chromaticity and the average color rendering index Ra to those of Example 1, an SCASN-based phosphor having a peak emission wavelength that is slightly different from that of Example 1 was used.
Phosphor (corresponding to the first phosphor) content: 3 parts by mass to 100 parts by mass of the base material of the sealing member filling the recessed portion of the package
Phosphor corresponding to the second phosphor: LAG-based phosphor (peak emission wavelength: 517 nm)
Phosphor (corresponding to the second phosphor) content: 72 parts by mass to 100 parts by mass of the base material of the sealing member filling the recessed portion of the package
The first and second phosphors used in Comparative Example 1 were dispersed in the sealing member which corresponds to the first wavelength converting member and the second wavelength converting member in Example 1 instead of disposing them in different resin portions.

Evaluation Results
  Table 1, Table 2, and Table 3 show the results of measuring the items described above with respect to Example 1 and Comparative Example 1. Table 1 shows samples of Example 1 and Comparative Example 1 which were not provided with a DBR film as the reflective film at the bottom of the light emitting elements. Table 2 shows samples of Example 1 and Comparative Example 1 which were provided with a DBR film as the reflective film at the bottom of the light emitting elements. Table 3 shows samples of Example 1 provided with or without DBR film as the reflective film at the bottom of the light emitting elements.

In Table 1, Table 2, and Table 3, the x and y values show chromaticity values calculated based on the XYZ chromaticity scale system specified by CIE (International Commission on Illumination). This similarly applies to Tables 4-5 discussed later.

With respect to samples shown in each table, those samples shown in the same table were produced under the same conditions other than the differences that were specified clearly, but the production conditions might differ between the samples shown in different tables.

TABLE 1

Without DBR film

| Item | x | y | Luminous Flux | Ra | R9 |
|---|---|---|---|---|---|
| Comparative Example 1 | 0.366 | 0.367 | 30.4 | 87.2 | 29.1 |
| Example 1 | 0.367 | 0.366 | 31.0 | 89.8 | 27.8 |

TABLE 2

With DBR film

| Item | x | y | Luminous Flux | Ra | R9 |
|---|---|---|---|---|---|
| Comparative Example 1 | 0.370 | 0.372 | 31.0 | 86.8 | 26.2 |
| Example 1 | 0.371 | 0.372 | 31.5 | 89.3 | 25.1 |

TABLE 3

Comparison between with and without DBR film

| Item | x | y | Luminous Flux | Ra | R9 |
|---|---|---|---|---|---|
| Without DBR film | 0.364 | 0.363 | 31.0 | 90.0 | 29.2 |
| With DBR film | 0.365 | 0.362 | 31.3 | 90.1 | 30.0 |

As shown in Table 1, in the case where no DBR film was provided, it can be confirmed that both the luminous flux and the average color rendering index Ra were higher in Example 1 than Comparative Example 1. It can also be confirmed that the special color rendering index R9 for the red color chart was higher in Comparative Example 1.

It is believed that the amount of the green light emitted by the second phosphor that was converted into red light by the first phosphor was greater in Comparative Example 1 because the first phosphor and the second phosphor were present in a mixed state. In contrast, the first phosphor and the second phosphor were disposed separately from one another in Example 1, which made it difficult for the green light emitted by the second phosphor to be absorbed by the first phosphor. It is thus conceivable that a decrease in the amount of high-luminosity green light was moderated, thereby relatively increasing the luminous flux, and the average color rendering Ra which represents the assessed value of the color rendering quality with respect to the color charts of varying hues.

As shown in Table 2, in the case where a DBR film was provided, one can confirm similar trends for the luminous flux, the average color rendering index Ra, and the special color rendering index R9 to those observed in the case where no DBR film was provided.

Because the amount of red light increased in Comparative Example 1, the special color rendering index R9 was higher than that of Example 1. For Example 1, even though the special color rendering index R9 was lower, the average color rendering index Ra improved at a greater degree. It can therefore be said that Example 1 achieved higher overall coloring rendering quality.

It is thus understood that the luminous flux and the color rendering quality can be improved by separately disposing the first phosphor and the second phosphor, and arranging them to make it difficult for the first phosphor to absorb the light emitted by the second phosphor.

As shown in Table 3, one can confirm that the luminous flux improved in Example 1. One can also confirm that the special color rendering index R9 also improved in Example 1.

It is thus understood that disposing a DBR film can improve the efficiency of extracting the blue light emitted by the light emitting element from the upper face side, thereby increasing the output of the light emitting device.

It is also understood that providing the DBR film with the ability to transmit red light and increasing red light extraction paths by bonding the light emitting element using a light transmissive bonding member can increase the amount of red light thereby improving the color rendering quality with respect to the red color chart.

Example 2

Production Conditions

Example 2 slightly differs from Example 1 in terms of the contents and particle sizes of the first phosphor and the second phosphor; the other conditions are the same as Example 1.

Comparative Example 2 differs from Example 2 such that the second phosphor is dispersed in the base material of the second wavelength converting member instead of allowing the second phosphor to settle. The other conditions are the same as Example 2.

Evaluation Results

Table 4 and Table 5 show the results of measuring the items described above with respect to Example 2 and Comparative Example 2. Table 4 shows samples of Example 2 and Comparative Example 2 without a DBR film as the reflective film at the bottom of the light emitting elements. Table 5 shows samples of Example 2 and Comparative Example 2 provided with a DBR film as the reflective film at the bottom of the light emitting elements.

TABLE 4

Without DBR film

| Item | x | y | Luminous Flux | Ra | R9 |
|---|---|---|---|---|---|
| Comparative Example 2 | 0.359 | 0.352 | 30.6 | 90.9 | 35.7 |
| Example 2 | 0.360 | 0.352 | 30.7 | 91.0 | 36.0 |

TABLE 5

With DBR film

| Item | x | y | Luminous Flux | Ra | R9 |
|---|---|---|---|---|---|
| Comparative Example 2 | 0.362 | 0.354 | 31.0 | 90.9 | 35.0 |
| Example 2 | 0.362 | 0.353 | 31.0 | 90.8 | 35.3 |

As shown in Table 4, in the case where no DBR film was provided, it can be confirmed that the special color rendering index R9 with respect to the red color chart for Example 2 improved by about 1% as compared to Comparative Example 2, even though the luminous flux and the average color rendering index Ra were about the same as those of Comparative Example 2.

As shown in Table 5, in the case where a DBR film was provided, similar trends between Example 2 and Comparative Example 2 to those in the case of no DBR film can be confirmed.

It is thus understood that the color rendering quality with respect to the red color chart can be improved by allowing the second phosphor to settle towards the bottom face as in the case of the light emitting device of Example 2.

The mode for carrying out the embodiment of the invention with respect to the light emitting device has been specifically explained above. The present invention, however, is not limited to those described above, and should be interpreted broadly based on the scope of the invention as defined by the accompanying claims. It goes without saying that various modifications and alterations would also fall within the scope of the present invention.

The light emitting device according to the embodiments of the present disclosure can be utilized as a light source for liquid crystal display backlights, various types of lighting equipment, large scale displays, various display devices such as advertisement panels and destination signs, image pickup devices such as digital video cameras, facsimiles, copiers, and scanners, and projectors.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a base;
   a light emitting element disposed on the base to emit a first light having a first peak wavelength, the light emitting element having a lower surface facing the base, an upper surface opposite to the lower surface in a height direction of the light emitting device, and lateral surfaces connecting the upper surface and the lower surface;
   a first wavelength converting member covering the lateral surfaces of the light emitting element and containing a first phosphor to convert the first light emitted from the light emitting element into a second light having a second peak wavelength longer than the first peak wavelength; and
   a second wavelength converting member covering the upper surface of the light emitting element and the base and containing a second phosphor to convert the first light emitted from the light emitting element into a third light having a third peak wavelength longer than the first peak wavelength and shorter than the second peak wavelength, the second wavelength converting member including a portion which covers the base and in which the second wavelength converting member has a first concentration of the second phosphor at a height of the upper surface of the light emitting element in the height direction and a second concentration of the second phosphor at a height of the lower surface of the light emitting element in the height direction, the second concentration being higher than the first concentration such that the second phosphor reflects the second light.

2. The light emitting device according to claim 1, wherein the first concentration is one half of the second concentration at most.

3. The light emitting device according to claim 1, wherein the base has an upper surface and a recessed portion recessed from the upper surface in the height direction, and the light emitting element is disposed on a bottom surface of the recessed portion.

4. The light emitting device according to claim 1, wherein
   the light emitting element emits blue light,
   the first phosphor emits red light, and
   the second phosphor emits green to yellow light.

5. The light emitting device according to claim 1, wherein the lower surface of the light emitting element is bonded to the base via a light transmissive bonding member.

6. The light emitting device according to claim 5, wherein
   the light emitting element has a reflective film at the lower surface,
   the reflective film is to reflect the first light having the first peak wavelength, and transmit the second light having the second peak wavelength.

7. The light emitting device according to claim 6, wherein the reflective film is a distributed Bragg reflector (DBR) film, which is a dielectric multilayer film to reflect the first light having the first peak wavelength of the light emitting element, and transmits the second light having the second peak wavelength.

8. The light emitting device according to claim 1, wherein the second wavelength converting member having a portion in which the second phosphor is disposed in a layer and which is at least a portion where the second wavelength converting member covers the base, and a thickness of the layer does not exceed three quarters of the height of the light emitting element in the height direction.

9. The light emitting device according to claim 1, wherein
   the first wavelength converting member does not cover the upper surface of the light emitting element, and
   the second wavelength converting member is in contact with the light emitting element.

10. A light emitting device comprising:
    a base;
    a light emitting element disposed on the base to emit a first light having a first peak wavelength, the light emitting element having a lower surface facing the base, an upper surface opposite to the lower surface in a height direction of the light emitting device, and lateral surfaces connecting the upper surface and the lower surface;
    a first wavelength converting member covering the lateral surfaces of the light emitting element and containing a first phosphor to convert the first light emitted by the light emitting element into a second light having a second peak wavelength longer than the first peak wavelength; and
    a second wavelength converting member containing a second phosphor to convert the first light emitted from the light emitting element into a third light having a third peak wavelength longer than the first peak wavelength and shorter than the second peak wavelength, the second wave length converting member including:
      a first portion covering the upper surface of the light emitting element; and
      a second portion covering the base and being separated from the first portion such that the first wavelength converting member is exposed from the second wavelength converting member between the first portion and the second portion.

11. The light emitting device according to claim 10, wherein the second wavelength converting member has a first cross-sectional area ranging from a height of the upper surface of the light emitting element to a middle height between the upper surface and the lower surface of the light emitting element in the height direction and has a first area ratio which is a percentage of a cross-sectional area of second phosphor particles taken along a plane in the first cross-sectional area, wherein the second wavelength converting member has a second cross-sectional area ranging from the middle height to the base in the height direction and has a second area ratio which is a percentage of a cross-sectional area of the second phosphor particles taken along a plane in the second cross-sectional area, wherein the second area ratio being higher than the first area ratio, and wherein the first area ratio and the second area ratio are determined by the percentages of the cross-sectional area of the second phosphor particles occupying the first cross-sectional area and the second cross-sectional area in all of the respective height ranges, respectively.

12. The light emitting device according to claim 10, wherein the second wavelength converting member has a first cross-sectional area ranging from a height of the upper surface of the light emitting element to a middle height between the upper surface and the lower surface of the light emitting element in the height direction and has a first area ratio which is a percentage of a cross-sectional area of second phosphor particles taken along a plane in the first cross-sectional area, wherein the second wavelength converting member has a second cross-sectional area ranging from the middle height to the base in the height direction and has a second area ratio which is a percentage of a cross-sectional area of the second phosphor particles taken along a plane in the second cross-sectional area, wherein the second area ratio being higher than the first area ratio, and wherein the first cross-sectional area and the second cross-sectional area are rectangular areas extending from one of the lateral surfaces of the light emitting element to a distance equivalent to a height of the light emitting element in a lateral direction perpendicular to the height direction.

13. The light emitting device according to claim 10, wherein the second wavelength converting member has a first cross-sectional area ranging from a height of the upper surface of the light emitting element to a middle height between the upper surface and the lower surface of the light emitting element in the height direction and has a first area ratio which is a percentage of a cross-sectional area of second phosphor particles taken along a plane in the first cross-sectional area, wherein the second wavelength converting member has a second cross-sectional area ranging from the middle height to the base in the height direction and has a second area ratio which is a percentage of a cross-sectional area of the second phosphor particles taken along a plane in the second cross-sectional area, wherein the second area ratio being higher than the first area ratio, and wherein the first area ratio is 50% at most.

14. The light emitting device according to claim 10, wherein the second wavelength converting member has a first cross-sectional area ranging from a height of the upper surface of the light emitting element to a middle height between the upper surface and the lower surface of the light emitting element in the height direction and has a first area ratio which is a percentage of a cross-sectional area of second phosphor particles taken along a plane in the first cross-sectional area, wherein the second wavelength converting member has a second cross-sectional area ranging from the middle height to the base in the height direction and has a second area ratio which is a percentage of a cross-sectional area of the second phosphor particles taken along a plane in the second cross-sectional area, wherein the second area ratio being higher than the first area ratio, and wherein the first area ratio is one half of the second area ratio at most.

15. A light emitting device comprising:

a base;

a light emitting element disposed on the base to emit a first light having a first peak wavelength, the light emitting element having a lower surface facing the base, an upper surface opposite to the lower surface in a height direction of the light emitting device, and lateral surfaces connecting the upper surface and the lower surface;

a first wavelength converting member covering the lateral surfaces of the light emitting element and containing a first phosphor to convert the first light emitted from the light emitting element into a second light having a second peak wavelength longer than the first peak wavelength; and a second wavelength converting member containing a second phosphor to convert the first light emitted from the light emitting element into a third light having a third peak wavelength longer than the first peak wavelength and shorter than the second peak wavelength, the second wavelength converting member including:

a first portion covering the upper surface of the light emitting element; and a second portion covering the base and being separated from the first portion such that the first wavelength converting member is exposed from the second wavelength converting member between the first portion and the second portion, the second phosphor being disposed in a form of a layer at least in the second portion, a thickness of the layer being equal to or lower than three quarters of the height of the light emitting element.

16. The light emitting device according to claim 15, wherein the second wavelength converting member, at least in the second portion, is substantially free from the second phosphor above three quarters of the height of the light emitting element in the height direction.

* * * * *